United States Patent

Sommer

Patent Number: 5,323,701
Date of Patent: Jun. 28, 1994

[54] SCREEN PRINTING APPARATUS

[75] Inventor: Peter Sommer, Duisburg, Fed. Rep. of Germany

[73] Assignee: Rheinmetall GmbH, Ratingen, Fed. Rep. of Germany

[21] Appl. No.: 15,906

[22] Filed: Feb. 10, 1993

[30] Foreign Application Priority Data

Feb. 14, 1992 [DE] Fed. Rep. of Germany ....... 4204390

[51] Int. Cl.$^5$ ............................................ B05C 17/06
[52] U.S. Cl. .................................. 101/126; 101/474; 118/500
[58] Field of Search ............... 101/114, 126, 129, 474; 427/96; 118/500

[56] References Cited

U.S. PATENT DOCUMENTS

| | | | |
|---|---|---|---|
| 3,418,931 | 12/1968 | Wilford | 101/126 |
| 4,066,039 | 1/1978 | Fletcher et al. | 118/500 |
| 4,173,928 | 11/1979 | Mitter | 101/126 |
| 4,649,816 | 3/1987 | Gasper et al. | 101/126 |
| 5,195,434 | 3/1993 | Hoffman | 101/126 |
| 5,205,896 | 4/1993 | Brown et al. | 156/297 |

*Primary Examiner*—Edgar S. Burr
*Assistant Examiner*—Christopher A. Bennett
*Attorney, Agent, or Firm*—Spencer, Frank & Schneider

[57] ABSTRACT

An apparatus for screen printing a conductor pattern on a circuit board blank includes a receiving frame having a nest for seating the circuit board blank. The nest includes a porous stone having a surface for supporting the circuit board blank. Air is drawn through the porous stone for urging the circuit board blank against the porous stone. There is further provided a screen printing mechanism for printing on the circuit board blank seated in the nest.

1 Claim, 1 Drawing Sheet

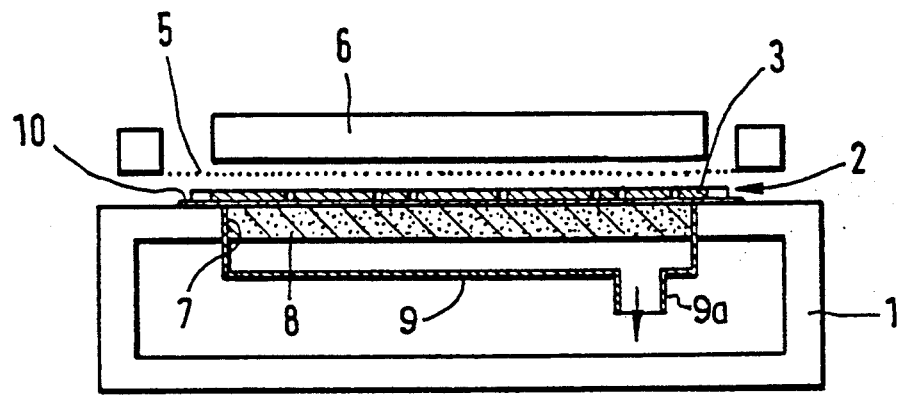

SCREEN PRINTING APPARATUS

CROSS REFERENCE TO RELATED APPLICATION

This application claims the priority of German Application No. P 42 04 390.5 filed Feb. 14, 1992, which is incorporated herein by reference.

BACKGROUND OF THE INVENTION

This invention relates to a screen printing apparatus for providing a pattern of conductor strips on circuit board blanks. The apparatus has a receiving frame provided with a screen printing nest for the circuit board blank to support the same in a planar manner. The screen printing nest may be exposed to vacuum at those sides which are oriented away from the circuit board blank.

In the manufacture of circuit boards for producing multilayer circuits, particularly on unfired (green) ceramic films which undergo sintering at low temperatures, conductor patterns are printed with an electrically conductive paste on the green circuit board blanks. Such a process is described in an article by J.I. Steinberg, S.J. Horowitz and R.J. Bacher, entitled "Herstellen yon Mehrlagenschaltungen mit niedrig sinternden grünen Keramikfolien" ("Manufacture of Multilayer Circuits with Green Ceramic Films Undergoing Sintering at Low Temperatures") in the periodical "Elektronikproduktion & Prüftechnik", Issue 9A of 1986. According to this article, the screen printing apparatus utilizes a screen printing nest serving as the backup support for the green ceramic film and is provided with a plurality of small holes through which vacuum is applied to immobilize the green ceramic film. Care has to be taken that the holes in the screen printing nest should be sufficiently small so that the outline of the holes will not be reproduced on the printed side of the film. In observing such a requirement, the manufacture of printing screen nests involves significant expense. In case pass-through contacts are to be provided, where very small tolerances have to be observed, risks are high that the underlying hole in the screen printing nest will be soiled.

SUMMARY OF THE INVENTION

It is an object of the invention to provide an improved screen printing apparatus of the above-outlined type which has a screen printing nest that can be manufactured at low expense.

This object and others to become apparent as the specification progresses, are accomplished by the invention, according to which, briefly stated, the screen printing nest of the apparatus includes an insert made of a porous (air-pervious) stone through which vacuum may be applied.

The porous, natural or artificial stone, for example, pumice used as a support base for the sintered or unsintered (green) circuit board blanks is significantly simpler and thus less expensive to manufacture than a screen printing nest having a great plurality of small holes. The porous stone affords a planar support for the circuit board blanks and a simple application of a vacuum stream. The screen printing nest provided with a porous stone according to the invention has a configuration which is independent from the pattern of the conductor strips and thus independent from the location of pass-through contacts. In case pass-through contacts are to be provided, the porous stone is expediently covered with a porous film to prevent soiling of the stone during the screen printing which could render the stone useless.

BRIEF DESCRIPTION OF THE DRAWING

The sole Figure is a schematic sectional side elevational view of a preferred embodiment of the invention.

DESCRIPTION OF THE PREFERRED EMBODIMENT

Turning to the Figure, the screen printing apparatus illustrated therein has a receiving frame 1 which includes a screen printing nest 2 for seating therein a circuit board blank 3 such as a green ceramic film provided with holes for pass-through contacts. Above the receiving frame 1 there is supported a screen 5 and a squeegee 6 for printing a conductor pattern with a substance consisting of an appropriate, electrically conducting paste, for example, a silver alloy.

The screen printing nest 2 is provided with an aperture 7 which accommodates a porous stone 8 flush with the upper side of the screen printing nest 2. The face oriented towards the circuit board blank 3 is ground planar. The underside of the porous stone 8 is facing a shroud 9 to which vacuum is applied through a nipple 9a from a vacuum source, not shown. In this manner, the circuit board blank 3 is held in the nest 2 by vacuum against the upper face of the porous stone 8.

On the porous stone 8 a porous film 10 is positioned which does not interfere with the application of vacuum on the circuit board blank 3, but prevents a soiling of the upper face of the porous stone 8 by the electrically conducting paste as pass-through contacts traversing the film are provided during the screen printing process.

It will be understood that the above description of the present invention is susceptible to various modifications, changes and adaptations, and the same are intended to be comprehended within the meaning and range of equivalents of the appended claims.

What is claimed is:

1. An apparatus for screen printing a conductor pattern on a circuit board blank, comprising a receiving frame including a nest for seating the circuit board blank; said nest including a porous stone having a surface for supporting the circuit board blank; vacuum means for drawing air through said porous stone for urging the circuit board blank against said porous stone; screen printing means for printing on the circuit board blank seated in said nest; and means for preventing soiling of said surface by said screen printing means including a porous film covering said surface of said porous stone; said porous film allowing passage of air therethrough.

* * * * *